(12) United States Patent
Zhang et al.

(10) Patent No.: US 12,065,755 B2
(45) Date of Patent: Aug. 20, 2024

(54) METHOD FOR GROWING A GaN SINGLE CRYSTAL FILM ON A BUFFER LAYER ON A ScAlMgO4 SUBSTRATE AND PERFORMING COOLING SO THAT THE GaN FILM IS PEELED FROM THE ScAlMgO4 SUBSTRATE

(71) Applicant: WUXI WUYUE SEMICONDUCTOR CO. LTD., Wuxi (CN)

(72) Inventors: Haitao Zhang, Wuxi (CN); Bin Xu, Wuxi (CN); Bo Pang, Wuxi (CN); Lianghong Liu, Wuxi (CN)

( * ) Notice: Subject to any disclaimer, the term of this patent is extended or adjusted under 35 U.S.C. 154(b) by 0 days.

(21) Appl. No.: 17/761,607

(22) PCT Filed: Apr. 27, 2021

(86) PCT No.: PCT/CN2021/090179
§ 371 (c)(1),
(2) Date: Mar. 18, 2022

(87) PCT Pub. No.: WO2021/244188
PCT Pub. Date: Dec. 9, 2021

(65) Prior Publication Data
US 2022/0372652 A1    Nov. 24, 2022

(30) Foreign Application Priority Data

Jun. 2, 2020  (CN) .......................... 202010487573.7

(51) Int. Cl.
| | | |
|---|---|---|
| C30B 25/18 | (2006.01) | |
| C23C 14/06 | (2006.01) | |
| C23C 14/34 | (2006.01) | |
| C23C 14/58 | (2006.01) | |
| C30B 25/16 | (2006.01) | |
| C30B 29/40 | (2006.01) | |

(52) U.S. Cl.
CPC ........ C30B 25/183 (2013.01); C23C 14/0617 (2013.01); C23C 14/34 (2013.01); C23C 14/5806 (2013.01); C30B 25/16 (2013.01); C30B 29/406 (2013.01)

(58) Field of Classification Search
CPC ....... C30B 23/00; C30B 23/02; C30B 23/025; C30B 25/00; C30B 25/02; C30B 25/16; C30B 25/18; C30B 25/183; C30B 25/186; C30B 29/00; C30B 29/10; C30B 29/40; C30B 29/403; C30B 29/406; C23C 14/0617; C23C 14/34; C23C 14/5806
USPC ......... 117/84, 88–90, 94, 103–106, 937, 952
See application file for complete search history.

(56) References Cited

U.S. PATENT DOCUMENTS

| | | | | |
|---|---|---|---|---|
| 2003/0232457 A1* | 12/2003 | Kawaguchi | ......... | H01L 21/0254 438/46 |
| 2017/0278754 A1* | 9/2017 | Tashiro | ................. | C30B 29/406 |
| 2018/0068849 A1 | 3/2018 | Matsuoka | | |

FOREIGN PATENT DOCUMENTS

| | | |
|---|---|---|
| CN | 106158592 A | 11/2016 |
| CN | 107190324 A | 9/2017 |
| CN | 109411329 A | 3/2019 |
| CN | 111607824 A | 9/2020 |
| JP | 2015178448 A | 10/2015 |
| KR | 20160136581 A * | 11/2016 |

OTHER PUBLICATIONS

ISR of PCT/CN2021/090179, mailed on Jul. 29, 2021.

* cited by examiner

*Primary Examiner* — Kenneth A Bratland, Jr.
(74) *Attorney, Agent, or Firm* — Zhigang Ma

(57) ABSTRACT

The present invention provides a preparation method of a gallium nitride single crystal based on a ScAlMgO$_4$ substrate, comprising following steps: (1) providing a ScAlMgO$_4$ substrate; (2) growing a buffer layer on a surface of the ScAlMgO$_4$ substrate; (3) annealing the buffer layer; (4) growing a GaN crystal on the buffer layer; (5) performing cooling, so that the GaN crystal is automatically peeled off from the ScAlMgO$_4$ substrate. The present invention does not need to use a complex MOCVD process for GaN deposition and preprocessing to make a mask or a separation layer, which effectively reduces production costs; compared with traditional substrates such as sapphire, it has higher quality and a larger radius of curvature, and will not cause a problem of OFFCUT non-uniformity for growing GaN over 4 inches; finally, the present invention can realize continuous growth into a crystal bar with a thickness of more than 5 mm, which further reduces the costs.

8 Claims, 1 Drawing Sheet

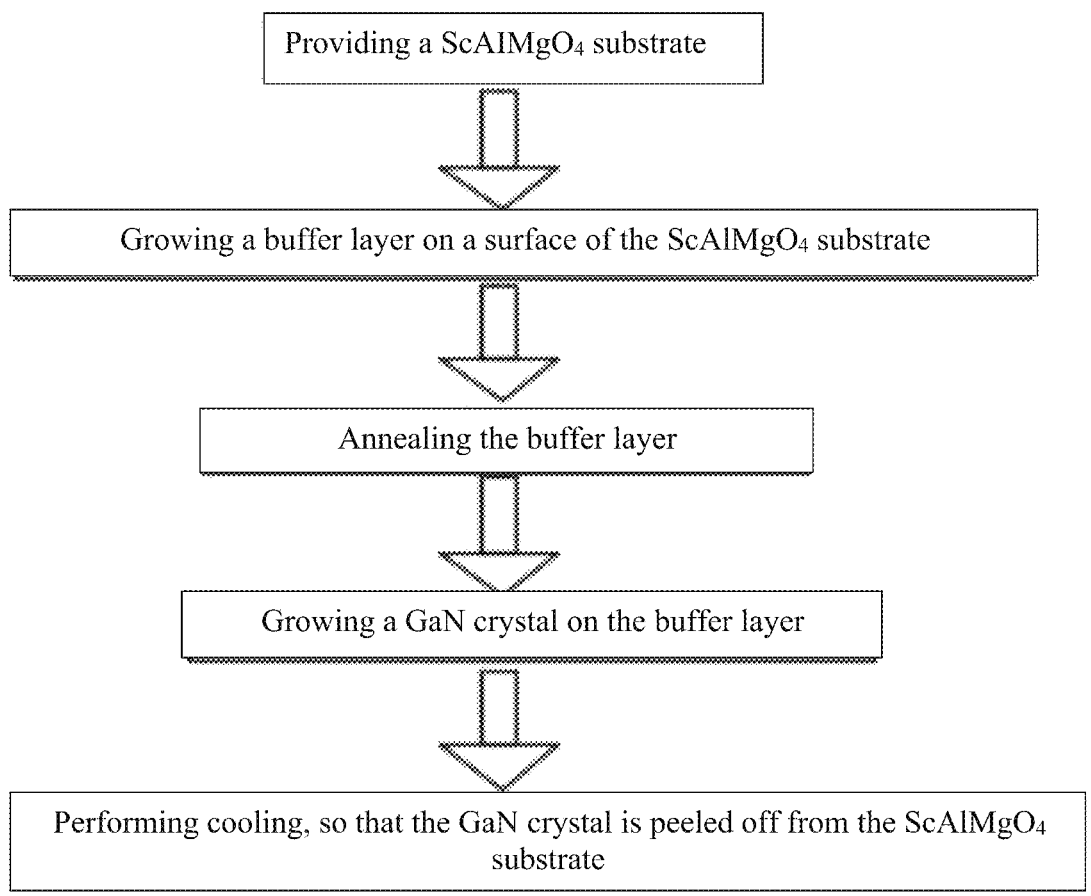

METHOD FOR GROWING A GaN SINGLE CRYSTAL FILM ON A BUFFER LAYER ON A ScAlMgO4 SUBSTRATE AND PERFORMING COOLING SO THAT THE GaN FILM IS PEELED FROM THE ScAlMgO4 SUBSTRATE

FIELD OF TECHNOLOGY

The present invention relates to the technical field of semiconductors, in particular, to a gallium nitride (GaN) single crystal film based on a ScAlMgO$_4$ substrate and a method for preparing the gallium nitride single crystal film based on a ScAlMgO$_4$ substrate.

BACKGROUND

GaN is a typical representative of the third generation wide band gap semiconductor. It has been widely used in semiconductor lighting, microwave power devices, power electronic devices, etc., showing great application prospects. The most ideal substrate for growing gallium nitride is naturally gallium nitride single crystal materials. Such homoepitaxy (that is, epitaxial layers and substrates are the same material) can greatly improve the crystal quality of epitaxial films, reduce dislocation densities, increase the working life of devices, improve luminous efficiencies, and increase the working current density of devices. However, growing gallium nitride single crystals is difficult and expensive, and large-scale homoepitaxial growth is currently still impossible. Therefore, heteroepitaxy, such as with silicon substrates, sapphire substrates, silicon carbide substrates, etc., is still used for the preparation of gallium nitride single crystals at present.

Basically all commercial GaN substrates (wafers, substrates) today are fabricated by MAT. However, its size is usually limited to 2 inches, and larger sizes such as 4 inches are limited by the radius of curvature. Moreover, due to the use of heteroepitaxy in MIT, the stress caused by lattice constants and thermal expansion coefficients can cause gallium nitride to crack when it is thickened or cooled.

The existing solution is to first use MOCVD to grow GaN films of several microns on sapphire surfaces and perform interface processing to form various masks, which, on the one hand, reduces initial defects during growth and forms stress-yielding substrates, so that the critical thickness of GaN growth is as large as possible, such as hundreds of microns or even a few millimeters, and on the other hand, creates weak interfaces, which can cause automatic peeling of GaN and sapphire or other substrates due to the shear stress introduced by different thermal expansion coefficients during cooling. The essence of this method is to reduce dislocations and stress during growth by inserting a transition layer on the interface of heterogeneous substrates, and to make the grown gallium nitride easily peel off from substrates such as sapphire during cooling.

However, such a method has shortcomings: sapphire-based HVPE grows gallium nitride crystals with relatively high dislocations due to the use of heterogeneous materials with a lattice mismatch constant of −13.9%, and the expansion to 4 inches is limited due to the curvature radius of stress below 10 meters. Meanwhile, complex stripping and dislocation reduction processes result in a low yield, and finally, only a single-chip method can be used, resulting in excessively high production costs.

SUMMARY

In view of the above problems and the shortcomings of the prior art, the present invention makes research and improvements, and provides a gallium nitride single crystal based on a ScAlMgO$_4$ substrate and a preparation method thereof. The present invention adopts ScAlMgO$_4$, whose lattice constant is very close to that of GaN, as the substrate for HVPE growth, and Obtains a GaN crystal with a dislocation density below 1E6 cm$^{-2}$ during growth by depositing a buffer layer on the ScAlMgO$_4$ substrate.

Specifically, the preparation method of a gallium nitride single crystal based on a ScAlMgO substrate provided by the present invention includes following steps:
(1) providing a ScAlMgO$_4$ substrate;
(2) growing a buffer layer on a surface of the ScAlMgO$_4$ substrate;
(3) annealing the buffer layer;
(4) growing a GaN crystal on the buffer layer;
(5) performing cooling, so that the GaN crystal is automatically peeled off from the ScAlMgO$_4$ substrate.

As a preferred setting of the present invention, the ScAlMgO$_4$ substrate is a circle or a regular hexagon.

As a preferred setting of the present invention, the surface of the ScAlMgO$_4$ substrate is polished, and have an atomic layer surface, a surface roughness of no more than 0.5 nm, and a c-plane OFFCUT of 0 to 1.5 degrees.

As a preferred setting of the present invention, the growing a buffer layer in step (2) adopts a low-temperature AlN sputtering method, with a temperature set to 300-800° C., and an AlN thickness of 10-300 nm, and in step (3), high-temperature annealing is performed on the buffer layer in an H$_2$/N$_2$ environment.

As a preferred setting of the present invention, the growing a buffer layer in step (2) is growing an AlN thin film template with a thickness of 1-10 μm by adopting an MOCVD method.

As a preferred setting of the present invention, the growing a buffer layer in step (2) adopts a high-temperature AlN HYPE method, with a temperature set to 1000-1600° C., and a thickness of 50-3000 nm, and in step (3), reducing at a high temperature of 1600-1700° C. or annealing in an inert environment is performed.

As a preferred setting of the present invention, the growing a buffer layer in step (2) adopts a low-temperature GaN HYPE method, with a temperature set to 300-800° C., and a thickness of about 20-500 nm, and in step (3), annealing at 950-1100° C. is performed.

As a preferred setting of the present invention, performing low-temperature AlN sputtering deposition on bottom and side surfaces of the ScAlMgO$_4$ substrate is further included between step (3) and step (4), with a temperature set to 300-800° C., and a thickness of no more than 50 nm.

As a preferred setting of the present invention, step (4) adopts a HYPE method, and further includes a method of maintaining continuous growth and morphology of a GaN single crystal thick film:
① continuously increasing a temperature, and an increase range of the temperature is 1-10° C. for every 1 mm increase in the GaN single crystal thick film;
② continuously increasing NH$_3$; an increase range of NH$_3$ (or corresponding V/III) is 5%-50% for every 1 mm increase in the GaN single crystal thick film.

The present invention also provides a gallium nitride single crystal based on a ScAlMgO$_4$ substrate, and the gallium nitride single crystal based on a ScAlMgO$_4$ substrate is prepared by the preparation method.

Beneficial effects of the present invention: firstly, the crystal grown by the process provided by the present invention effectively reduces dislocations; secondly, the present invention does not need to use a complex MOCVD process for GaN deposition and preprocessing to make a mask or a separation layer, which effectively reduces production costs; thirdly, compared with traditional substrates such as sapphire, the present invention has higher quality and a larger radius of curvature, and will not cause a problem of OFFCUT non-uniformity for growing GaN over 4 inches; finally, the present invention can realize continuous growth into a crystal bar with a thickness of more than 5 mm, which further reduces the costs.

BRIEF DESCRIPTION OF THE DRAWINGS

FIG. 1 is a production process flow chart of the present invention.

DESCRIPTION OF THE EMBODIMENTS

Through specific examples of the present invention below, technicians of the field can easily understand other advantages and efficacies of the present invention revealed by the specification. The present invention can also be implemented or applied through other different ways, and the details of the specification can also be modified or changed based on different views and applications without deviating from the spirit of the present invention.

It should be noted that the illustrations provided in these embodiments are only to illustrate the basic concept of the present invention in a schematic way, although the illustrations only show the components related to the present invention instead of being drawn according to the number, shape and size of the components in actual implementation. In actual implementation, the form, quantity and proportion of each component can be arbitrarily changed, and the component layout pattern may also be more complicated.

Embodiment 1

Please refer to FIG. 1, the present invention provides a preparation method of a gallium nitride single crystal based on a $ScAlMgO_4$ substrate, including following steps:
(1) providing a $ScAlMgO_4$ substrate;
(2) growing a buffer layer on a surface of the $ScAlMgO_4$ substrate;
(3) annealing the buffer layer;
(4) growing a GaN crystal on the buffer layer;
(5) performing cooling, so that the GaN crystal is peeled off from the $ScAlMgO_4$ substrate.

Referring to FIG. 1 and step (1), a $ScAlMgO_4$ substrate 100 is provided.

As a preferred setting of this embodiment, the $ScAlMgO_4$ substrate is a circle or a regular polygon; more preferably, the $ScAlMgO_4$ substrate is a circle or a regular hexagon.

As a preferred setting of this embodiment, the $ScAlMgO_4$ has high crystal quality, and its (001) XRDFWHM is usually less than 20 arcsec, preferably less than 10 aresec; the $ScAlMgO_4$ substrate has an atomic layer surface prepared by using CMP (that is, a chemical mechanical polishing process), which will not be repeated here.

In step (2), growing a buffer layer based on a surface of the $ScAlMgO_4$ substrate adopts a low-temperature AlN sputtering method. In this embodiment, the sputtering production process adopts a high-purity aluminum target (above 5N), and a mixed gas environment of $N_2$ and Ar, pressure is set to 0.1-2 Pa, and preferably, a low temperature range is set to 300-800° C.; more preferably, a low temperature range is set to 400-650° C.; more preferably, a low temperature range is set to 500-600° C.

As a preferred setting of this embodiment, in step (3), annealing is performed on the AlN buffer layer in an $H_2/N_2$ environment at 1200-2000° C.; more preferably, annealing is performed on the buffer layer in an $H_2/N_2$ environment at 1350-18500° C.; more preferably, annealing is performed on the buffer layer in an $H_2/N_2$ environment at 1600-17000.

As a preferred setting of this embodiment, performing low-temperature AN sputtering deposition at 300-800° C., preferably 400° C., on bottom and side surfaces of the $ScAlMgO_4$ substrate is farther included between step (3) and step (4), to form a protective layer with a thickness of no more than 50 nm on the bottom surface and side surfaces, so as to avoid decomposition and evolution of $O_2$ from $ScAlMgO_4$ during high-temperature growth, and improve purity of the grown GaN.

Step (4) adopts an HATE method, including HCl reacting with Ga at 700-900° C. to grow GaCl as a gallium source, $NH_3$ gas directly providing a nitrogen source, a temperature range being set to 900-1100° C., a VIII ratio being 2-1000, a carrier gas being $H_2/N_2$ mixture, and other HVPE process means well known to those skilled in the art, and further including a method of maintaining continuous growth and morphology of a GaN single crystal thick film:
① continuously increasing a temperature, and an increase range of the temperature is 1-10° C. for every 1 mm increase in the GaN single crystal thick film;
② continuously increasing $NH_3$; an increase range of $NH_3$ (or corresponding V/III) is 5%-50% for every 1 mm increase in the GaN single crystal thick film.

The present invention also provides a gallium nitride single crystal based on a $ScAlMgO_4$ substrate, and the gallium nitride single crystal based on a $ScAlMgO_4$ substrate is prepared based on the above preparation method.

Embodiment 2

The present invention also provides a preparation method of a gallium nitride single crystal based on a $ScAlMgO_4$ substrate. The preparation method of a gallium nitride single crystal based on a $ScAlMgO_4$ substrate described in this embodiment is substantially the same as the preparation method described in other embodiments, and the difference is: the growing a buffer layer in step (2) of Embodiment 2 is growing a thin film template with a thickness of 1-10 μm by adopting an MOCVD method, and its (102) XRDFWHM is less than 320 arcsec, preferably less than 240 aresec.

The MOCVD method is well known to those skilled in the art, and its principle is not repeated here.

In step (3), in-situ annealing is performed in an MOCVD furnace, that is, after low-temperature growth is completed, the temperature is raised to 1000° C. for annealing.

Embodiment 3

The present invention also provides a preparation method of a gallium nitride single crystal based on a $ScAlMgO_4$ substrate. The preparation method of a gallium nitride single crystal based on a $ScAlMgO_4$ substrate described in this embodiment is substantially the same as the preparation method described in other embodiments, the difference is that: the growing a buffer layer in step (2) of this embodiment adopts a high-temperature AlN HDPE method, Preferably, under the HYPE process conditions, a temperature is set to 1000-1600'C; more preferably, a temperature is set to 1200-1600° C.; more preferably, a temperature is set to 1500-1600° C., and a thickness is 50-3000 nm.

As a preferred setting of Embodiment 3 of the present invention, the buffer layer prepared by the AlN HVPE method can be allowed not to be annealed, and can also be annealed under a reducing environment at a high temperature of 1600-1700° C. in step (3).

Embodiment 4

The present invention also provides a preparation method of a gallium nitride single crystal based on a ScAlMgO$_4$ substrate. The preparation method of a gallium nitride single crystal based on a ScAlMgO$_4$ substrate described in this embodiment is substantially the same as the preparation method described in other embodiments, the difference is that the growing a buffer layer in step (2) adopts a low-temperature GaN HVPE method. Preferably, under the HVPE process conditions, a temperature is set to 300-800° C.; more preferably, a temperature is set to 400-700° C.; more preferably, a temperature is set to 500-600° C. A thickness is about 20-500 nm; more preferably, a temperature is set to 50-100 nm.

As a preferred setting of Embodiment 3 of the present invention, the buffer layer prepared by the low-temperature GaN HVPE method is annealed at 950-1100° C. in step (3).

Finally, it should be noted that the above embodiments are only used to illustrate the technical solutions of the present invention, but not to limit them; although the present invention has been described in detail with reference to the foregoing embodiments, those of ordinary skill in the art should understand that: they can still modify the technical solutions recorded in the foregoing embodiments, or perform equivalent replacements on some or all of technical features thereof; and these modifications or replacements do not snake the essence of the corresponding technical solutions depart from the scope of the technical solutions of the embodiments of the present invention. Any modification, equivalent replacement, improvement, etc. made within the spirit and principle of the present invention shall be included in the scope of the claims of the present invention.

Furthermore, it will be understood by those skilled in the art that although some of the embodiments described herein include certain features included in other embodiments and not others, combinations of features of different embodiments are meant to be within the scope of the present invention and form different embodiments. For example, in the above claims, any one of the claimed embodiments may be used in any combination. The information disclosed in this background art section is only for enhancement of understanding of the general background of the invention and should not be taken as an acknowledgment or any form of a suggestion that this information forms the prior art already known to those skilled in the art.

The invention claimed is:

1. A method for preparing a gallium nitride single crystal film based on a ScAlMgO$_4$ substrate, comprising following steps:
   (1) providing the ScAlMgO$_4$ substrate;
   (2) growing a buffer layer on a surface of the ScAlMgO$_4$ substrate;
   (3) annealing the buffer layer;
   (4) growing the gallium nitride single crystal film on the buffer layer;
   (5) performing cooling, so that the gallium nitride single crystal film is automatically peeled off from the ScAlMgO$_4$ substrate;
   wherein step (4) adopts an HVPE method, and comprises following steps to maintain continuous growth and morphology of the gallium nitride single crystal film:
   ① continuously increasing a temperature, and an increase in the temperature is 1-10° C. for every 1 mm increase in a thickness of the gallium nitride single crystal film; and
   ② continuously increasing NH$_3$; an increase in a ratio of NH$_3$ (or corresponding V/III) is 5%-50% for every 1 mm increase in the thickness of the gallium nitride single crystal film.

2. The method for preparing the gallium nitride single crystal film based on the ScAlMgO$_4$ substrate of claim 1, wherein the ScAlMgO$_4$ substrate is a circle or a regular hexagon.

3. The method for preparing the gallium nitride single crystal film based on the ScAlMgO$_4$ substrate of claim 2, wherein the surface of the ScAlMgO$_4$ substrate is polished, and have an atomic layer surface, a surface roughness of no more than 0.5 nm, and a c-plane OFFCUT of 0 to 1.5 degrees.

4. The method for preparing the gallium nitride single crystal film based on the ScAlMgO$_4$ substrate of claim 1, wherein the growing the buffer layer in step (2) adopts a low-temperature AlN sputtering method, with a temperature set to 300-800° C., and an AlN thickness of 10-300 nm, and in step (3), the annealing is performed on the buffer layer in an H$_2$/N$_2$ environment.

5. The method for preparing the gallium nitride single crystal film based on the ScAlMgO$_4$ substrate of claim 1, wherein the growing Randle buffer layer in step (2) is growing an AlN thin film template with a thickness of 1-10 μm by adopting an MOCVD method.

6. The preparation method of the gallium nitride single crystal film based on the ScAlMgO$_4$ substrate of claim 1, wherein the growing the buffer layer in step (2) adopts a high-temperature AlN HVPE method, with a temperature set to 1000-1600° C., and a thickness of 50-3000 nm, and in step (3), reducing at a high temperature of 1600-1700° C. or annealing in an inert environment is performed.

7. The method for preparing the gallium nitride single crystal film based on the ScAlMgO$_4$ substrate of claim 1, wherein the growing the buffer layer in step (2) adopts a low-temperature GaN HVPE method, with a temperature set to 300-800° C., and a thickness of about 20-500 nm, and in step (3), annealing at 950-1100° C. is performed.

8. The method for preparing the gallium nitride single crystal film based on the ScAlMgO$_4$ substrate of claim 1, wherein performing low-temperature AN sputtering deposition on bottom and side surfaces of the ScAlMgO$_4$ substrate is further comprised between step (3) and step (4), with a temperature set to 300-800° C., and a thickness of no more than 50 nm.

* * * * *